(12) United States Patent
Wheaton et al.

(10) Patent No.: US 12,169,931 B2
(45) Date of Patent: Dec. 17, 2024

(54) BACKEND SEQUENCE KERNEL

(71) Applicant: CANON MEDICAL SYSTEMS CORPORATION, Tochigi (JP)

(72) Inventors: Andrew James Wheaton, Vernon Hills, IL (US); Joseph Manak, Vernon Hills, IL (US); Bradley Stephens, Vernon Hills, IL (US)

(73) Assignee: CANON MEDICAL SYSTEMS CORPORATION, Tochigi (JP)

( * ) Notice: Subject to any disclaimer, the term of this patent is extended or adjusted under 35 U.S.C. 154(b) by 449 days.

(21) Appl. No.: 17/563,536

(22) Filed: Dec. 28, 2021

(65) Prior Publication Data

US 2023/0206427 A1    Jun. 29, 2023

(51) Int. Cl.
*G06T 7/00* (2017.01)
*G06N 20/10* (2019.01)
*G06T 7/11* (2017.01)

(52) U.S. Cl.
CPC .......... *G06T 7/0012* (2013.01); *G06N 20/10* (2019.01); *G06T 7/11* (2017.01); *G06T 2207/10088* (2013.01); *G06T 2207/20081* (2013.01)

(58) Field of Classification Search
CPC .................. G06T 7/0012; G06T 7/11; G06T 2207/10088; G06T 2207/20081; G06N 20/10
See application file for complete search history.

(56) References Cited

U.S. PATENT DOCUMENTS

| | | | |
|---|---|---|---|
| 2018/0217220 A1* | 8/2018 | Gulani | G01R 33/5676 |
| 2018/0267123 A1 | 9/2018 | Beck | |
| 2020/0003859 A1 | 1/2020 | Dannels et al. | |
| 2020/0025850 A1 | 1/2020 | Zeller et al. | |
| 2020/0363485 A1 | 11/2020 | Sun et al. | |

* cited by examiner

*Primary Examiner* — Chao Sheng
(74) *Attorney, Agent, or Firm* — Oblon, McClelland, Maier & Neustadt, L.L.P.

(57) ABSTRACT

An apparatus for magnetic resonance imaging includes processing circuitry to obtain a set of sequence instructions for performing a magnetic resonance scan; partition the obtained set of sequence instructions into a plurality of kernels by determining partition time points defining boundaries of the plurality of kernels, wherein the partition time points are not equally spaced in time; convert a first kernel of the plurality of kernels into a first hardware instruction set; transmit the first hardware instruction set to a hardware board controller for execution; and reconstruct a magnetic resonance image from received data, including data obtained by executing the first kernel.

19 Claims, 9 Drawing Sheets

BACKEND SEQUENCE KERNEL

BACKGROUND

Field of the Disclosure

The present disclosure relates an improved spectrometer for magnetic resonance imaging.

Description of the Related Art

Medical imaging generates images of the internal organs and tissues of a patient's body. For example, magnetic resonance imaging (MRI) uses radio waves, magnetic fields, and magnetic-field gradients to generate images of the internal organs and tissues. Once these images have been generated, a physician can use the images for diagnosing patient injuries or diseases.

An MR spectrometer performs several functions in an MR system, including translating a high-level sequence description into low-level hardware instructions, applying physics-based corrections to the low-level hardware instructions to attempt to correct for system imperfections, receive acquisition data and store the acquired data for subsequent reconstruction processing, and control other hardware elements of the MR system, including the gantry, magnets, etc.

Conventional MR spectrometers execute real-time scan control software that interprets the high-level sequence as one continuous stream of events, and continuously calculates machine-level commands from the continuous stream of events. In particular, the physics-based corrections are implemented by one or more FPGAs "on the fly" just before they are sent to the hardware for execution. Such conventional designs are adequate for static physics models that can be expressed in a straightforward manner using FPGAs, which are well-suited for applications requiring low latency and guaranteed timing.

In one conventional MR spectrometer design, the high-level sequence is broken into concatenated 'chunks' in which each chunk corresponds to a fixed period of time, e.g., 10 ms. Thus, with this conventional approach, the partition of the high-level sequence can occur within an echo train, breaking the echo train into multiple chunks, which can be problematic. For example, corrections or adjustments to chunks within the echo train can potentially disrupt the evolution of the spin physics. The boundaries between chunks must be controlled with high temporal precision to avoid spin evolution errors.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art against the present invention.

SUMMARY

The present disclosure relates to an improved spectrometer for magnetic resonance imaging.

According to an embodiment, the present disclosure further relates to an apparatus for magnetic resonance imaging, the apparatus comprising processing circuitry configured to (1) obtain a set of sequence instructions for performing a magnetic resonance scan; (2) partition the obtained set of sequence instructions into a plurality of kernels by determining partition time points defining boundaries of the plurality of kernels, wherein the partition time points are not equally spaced in time; (3) convert a first kernel of the plurality of kernels into a first hardware instruction set; (4) transmit the first hardware instruction set to a hardware board controller for execution; and (5) reconstruct a magnetic resonance image from received data, including data obtained by executing the first kernel.

According to an embodiment, the present disclosure further relates to a non-transitory computer-readable storage medium storing computer-readable instructions that, when executed by a computer, cause the computer to perform a method for performing magnetic resonance imaging, comprising obtaining a set of sequence instructions for performing a magnetic resonance scan; partitioning the obtained set of sequence instructions into a plurality of kernels by determining partition time points defining boundaries of the plurality of kernels, wherein the partition time points are not equally spaced in time; converting a first kernel of the plurality of kernels into a first hardware instruction set; transmitting the first hardware instruction set to a hardware board controller for execution; and reconstructing a magnetic resonance image from received data, including data obtained by executing the first kernel.

According to an embodiment, the present disclosure further relates to a method for performing magnetic resonance imaging, comprising obtaining a set of sequence instructions for performing a magnetic resonance scan; partitioning the obtained set of sequence instructions into a plurality of kernels by determining partition time points defining boundaries of the plurality of kernels, wherein the partition time points are not equally spaced in time; converting a first kernel of the plurality of kernels into a first hardware instruction set; transmitting the first hardware instruction set to a hardware board controller for execution; and reconstructing a magnetic resonance image from received data, including data obtained by executing the first kernel.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
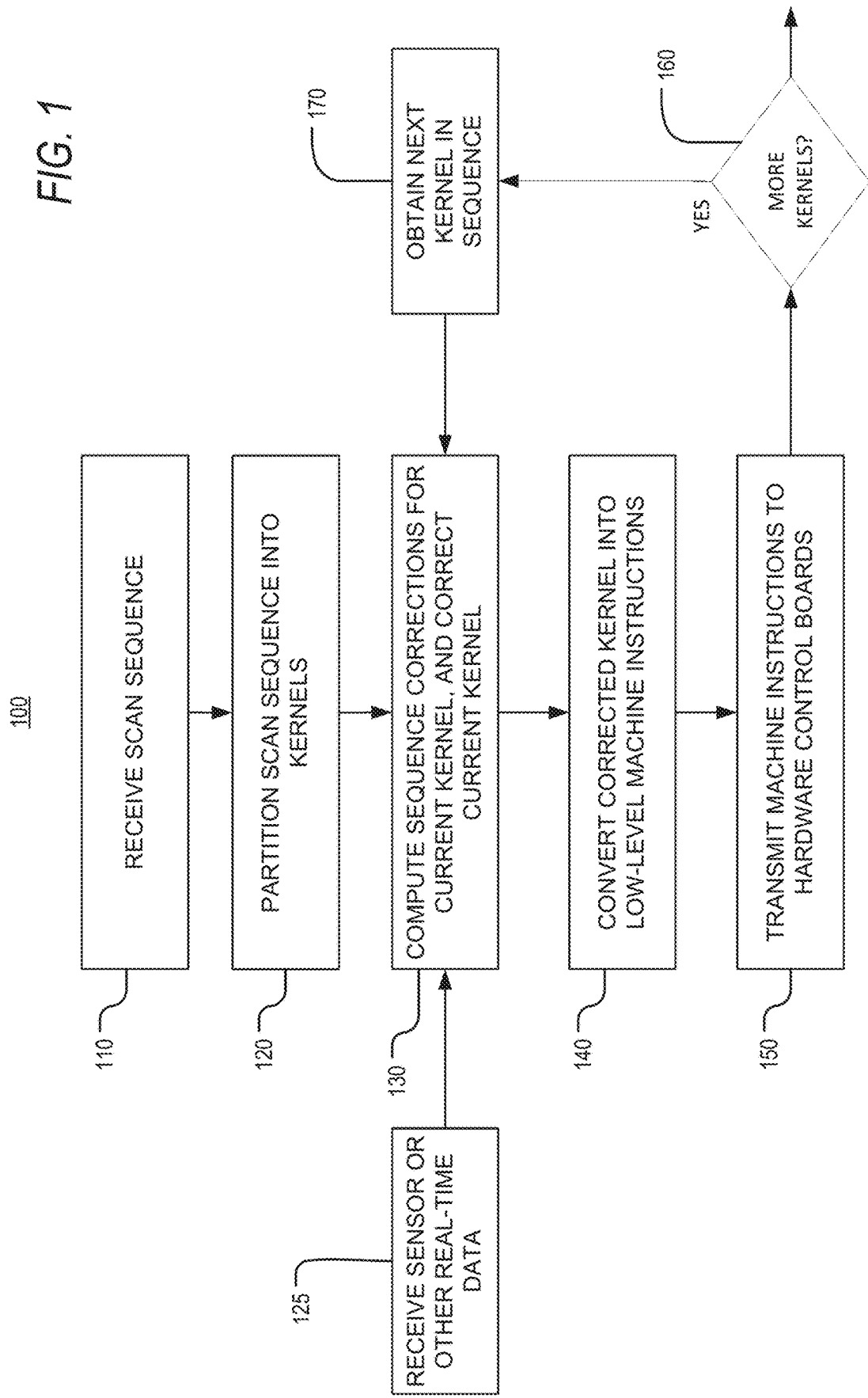
FIG. 1 illustrates a scan control method according to one embodiment of the present disclosure.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The exemplary embodiments are described in the context of methods having certain steps. However, the methods and compositions operate effectively with additional steps and steps in different orders that are not inconsistent with the exemplary embodiments. Thus, the present disclosure is not intended to be limited to the embodiments shown, but is to be accorded the widest scope consistent with the principles and features described herein and as limited only by the appended claims.

Furthermore, where a range of values is provided, it is to be understood that each intervening value between an upper and lower limit of the range—and any other stated or intervening value in that stated range—is encompassed within the disclosure. Where the stated range includes upper and lower limits, ranges excluding either of those limits are also included. Unless expressly stated, the terms used herein are intended to have the plain and ordinary meaning as understood by those of ordinary skill in the art. Any definitions are intended to aid the reader in understanding the present disclosure, but are not intended to vary or otherwise limit the meaning of such terms unless specifically indicated.

Multiple problems can arise with conventional MR spectrometers. First, the continuous streaming of high-level sequence events puts a high demand on the sequence interpreter software, which must keep up with microsecond precision and synchronization for an extended duration, potentially exceeding 10 minutes, for example. Second, in conventional designs, adapting the physics-based corrections to input real-time sensor data (e.g., thermal-based feedback) on-the-fly is difficult. Similarly, introducing updated or new physics models. (e.g., for unique clinical applications) can be difficult and require more powerful FPGA processing capabilities. While it is theoretically possible to implement on-the-fly adaptable physics models and updated physics models using FPGAs, such features will increasingly require more powerful FPGAs and/or specialized skill for development.

Accordingly, in an embodiment of the present disclosure, the high-level sequence instruction set is partitioned into chunks called "kernels." wherein each kernel represents a finite portion of the sequence. In particular, partition time points defining boundaries of the plurality of kernels are not generally equally spaced in time, but are placed at physically meaningful points. Specifically, each kernel describes a coherent system of spin physics, for example: (1) from an excite RF pulse to an end of an echo train. (2) from an inversion pulse to an excite RF pulse, and (3) a pre-pulse cluster (e.g., T2-prep).

In one embodiment, the boundaries between the kernels are determined automatically based on MR physics using definable heuristics. e.g., based on spin excitation, location of an RF pulse, or termination of a sequence module. Alternatively, the boundaries can be determined manually (e.g., by a pulse sequence engineer) or via a combination of automatically and manually.

Once determined, a scan controller will sequentially process the kernels one kernel at a time. In particular, the scan controller can "look ahead" kernel-by-kernel (instead of processing the sequence as one continuous flow) to adaptively apply the physics-based corrections to each individual kernel. Thus, some or all of the sequence adjustments or corrections conventionally executed by an FPGA can be executed in a "just-in-time" manner by the scan control software.

In an embodiment of the present disclosure, FIG. 1 illustrates a method 100 for performing scan control in an MR imaging system. The method of FIG. 1 can be performed. e.g., by processing circuitry of the MRI sequence controller 984 shown in FIG. 4.

Figure 3:
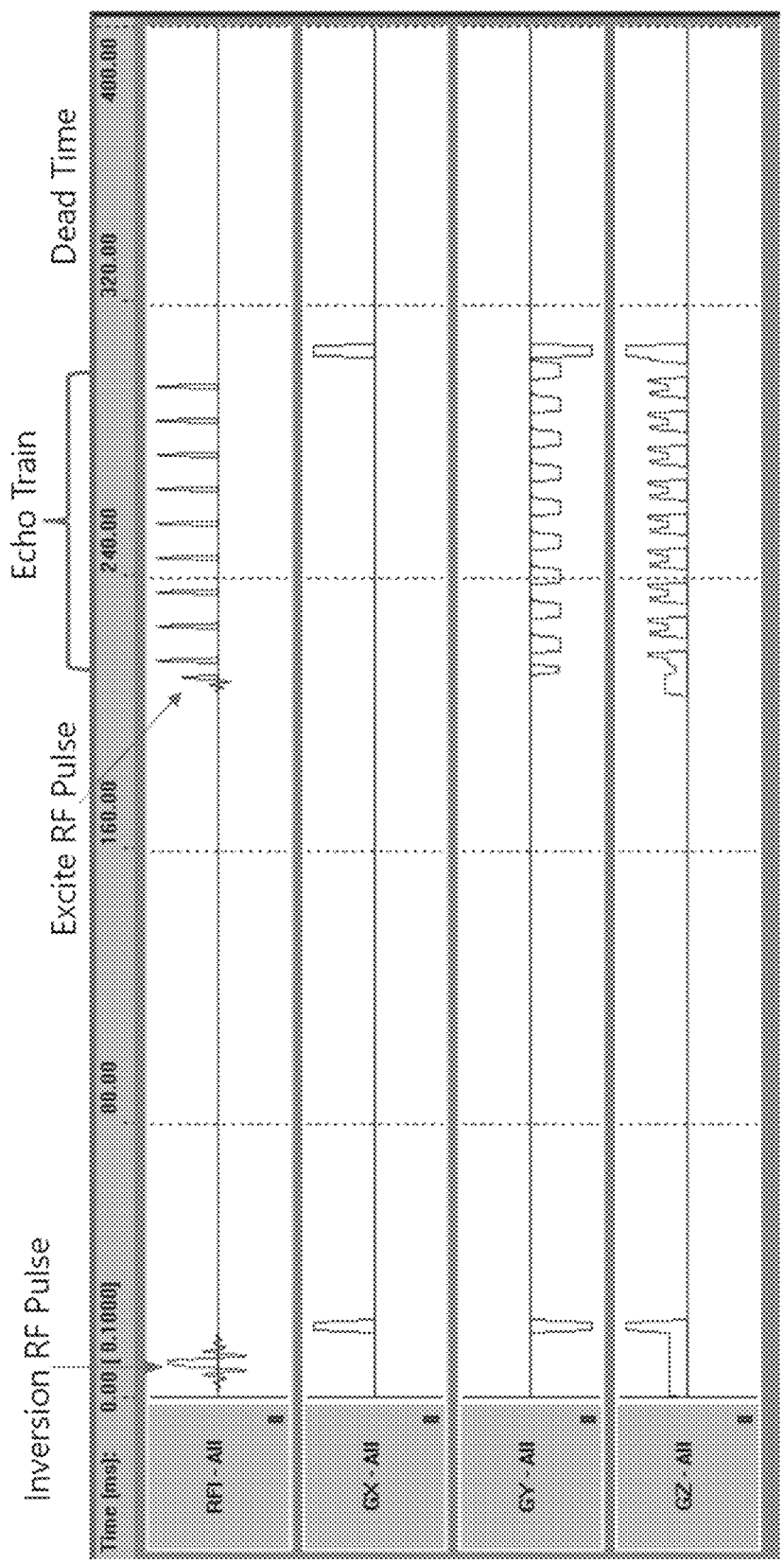
FIG. 3 illustrates an example of a high level one-slice FSE scan sequence.

In step 110, the high-level scan sequence is received. For example, FIG. 3 illustrates an example of a one-slice FSE sequence showing an RF inversion pulse, an RF excite pulse, and an echo train.

Figure 2:
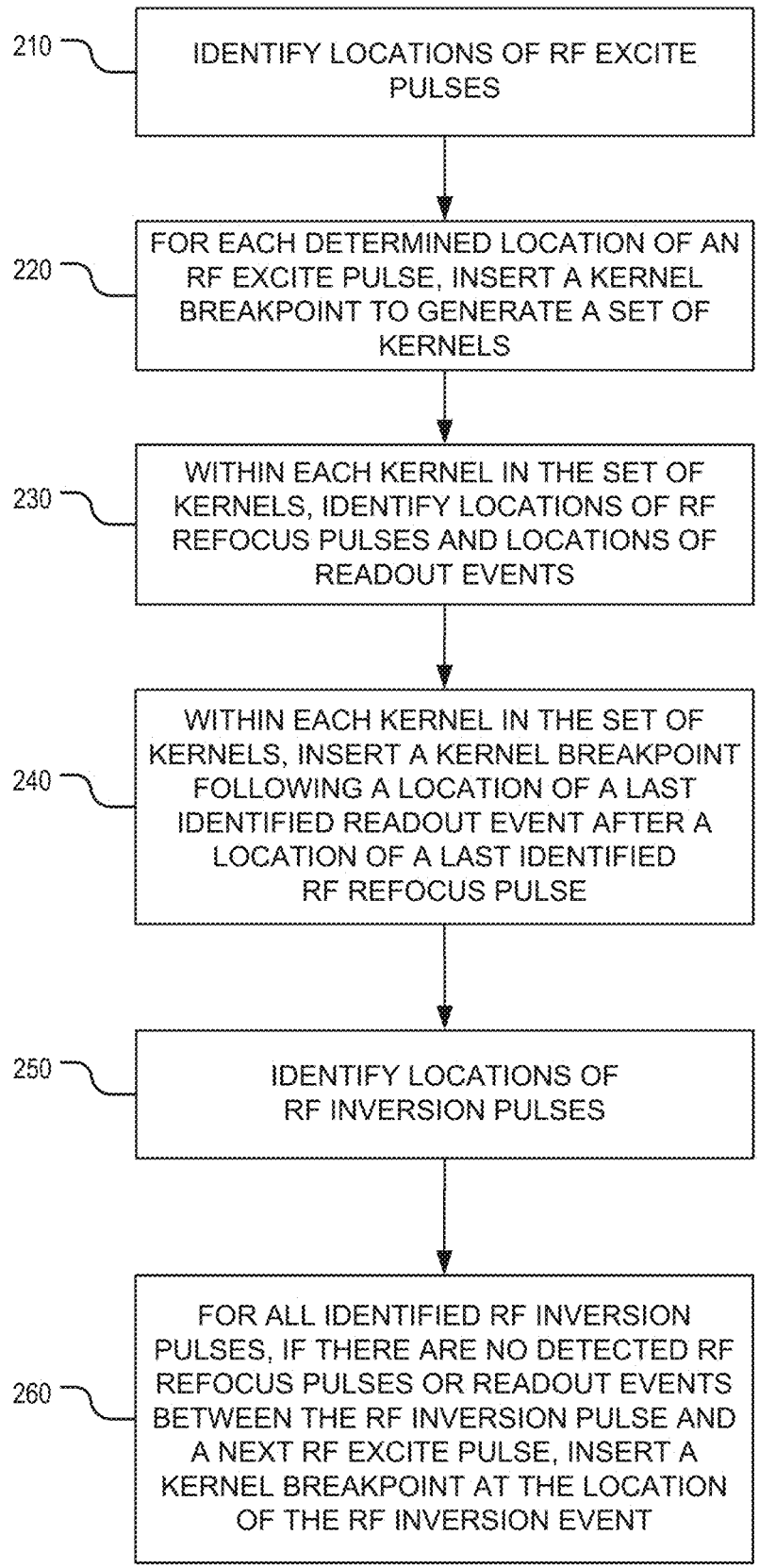
FIG. 2 illustrates an automatic method of partitioning a high-level scan sequence into kernels.

In step 120, the high-level scan sequence is partitioned into kernels by determining appropriate physics-based time boundaries for each kernel in the sequence. For example, the time boundaries between the kernels are determined automatically by a computer program executing on processing circuitry, based on MR physics using definable heuristics, e.g., based on spin excitation or the location of an RF pulses. FIG. 2 illustrates a flowchart of a method 200 of partitioning a high-level scan sequence into kernels, and is described in more detail below.

In step 130, sequence corrections are computed and applied only to the current kernel in the sequence. Such corrections can be based on the current state of sensor data, which is continuously or periodically received in step 125. For example, sensor data inputs related to at least one of thermal data, motion correction, and physiology gating can be used to determine the sequence corrections in step 130.

In step 140, the corrected kernel is converted into low-level machine instructions. Note, however, that the order of performing steps 130 and 140 can be reversed from that shown in FIG. 1. In particular, the physics-based corrections can be performed after converting the kernel into low-level machine instructions.

In step 150, the low-level machine instructions are transmitted to the appropriate hardware control boards for execution.

In step 160, it is determined whether there exist additional kernels in the sequence to be executed. If so, the process proceeds to step 170, in which the next kernel is obtained, after which step 130 is performed on the newly obtained kernel. Otherwise, the process ends.

FIG. 2 illustrates a method 200 of partitioning a high-level sequence into kernels according to a method of the present disclosure.

Figure 4:
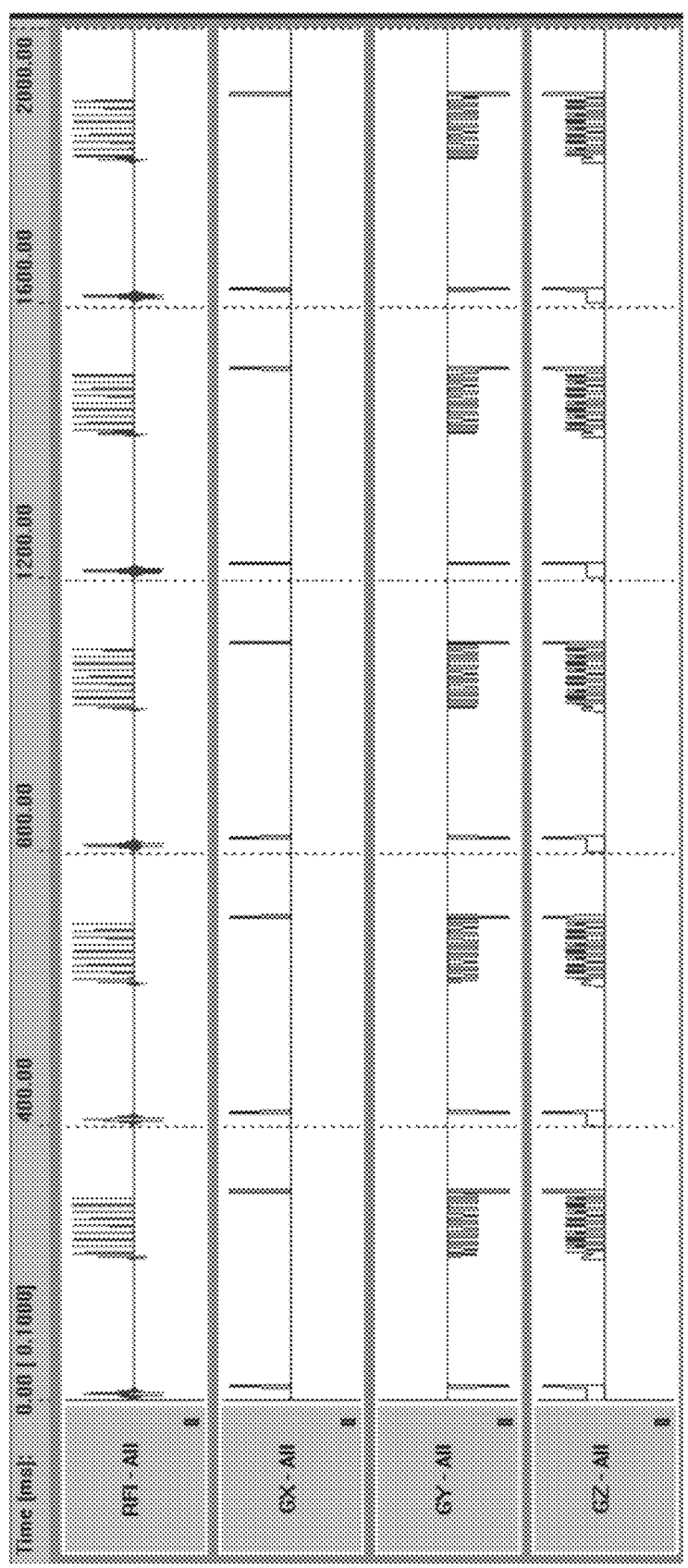
FIG. 4 illustrates an example of a high level five-slice FSE scan sequence.

In step 210, after receiving the scan sequence in step 110, locations of RF excite pulses within the scan sequence are identified. For example, a five-slice FSE sequence is shown in FIG. 4, with five RF excite pulses illustrated.

Figure 5:
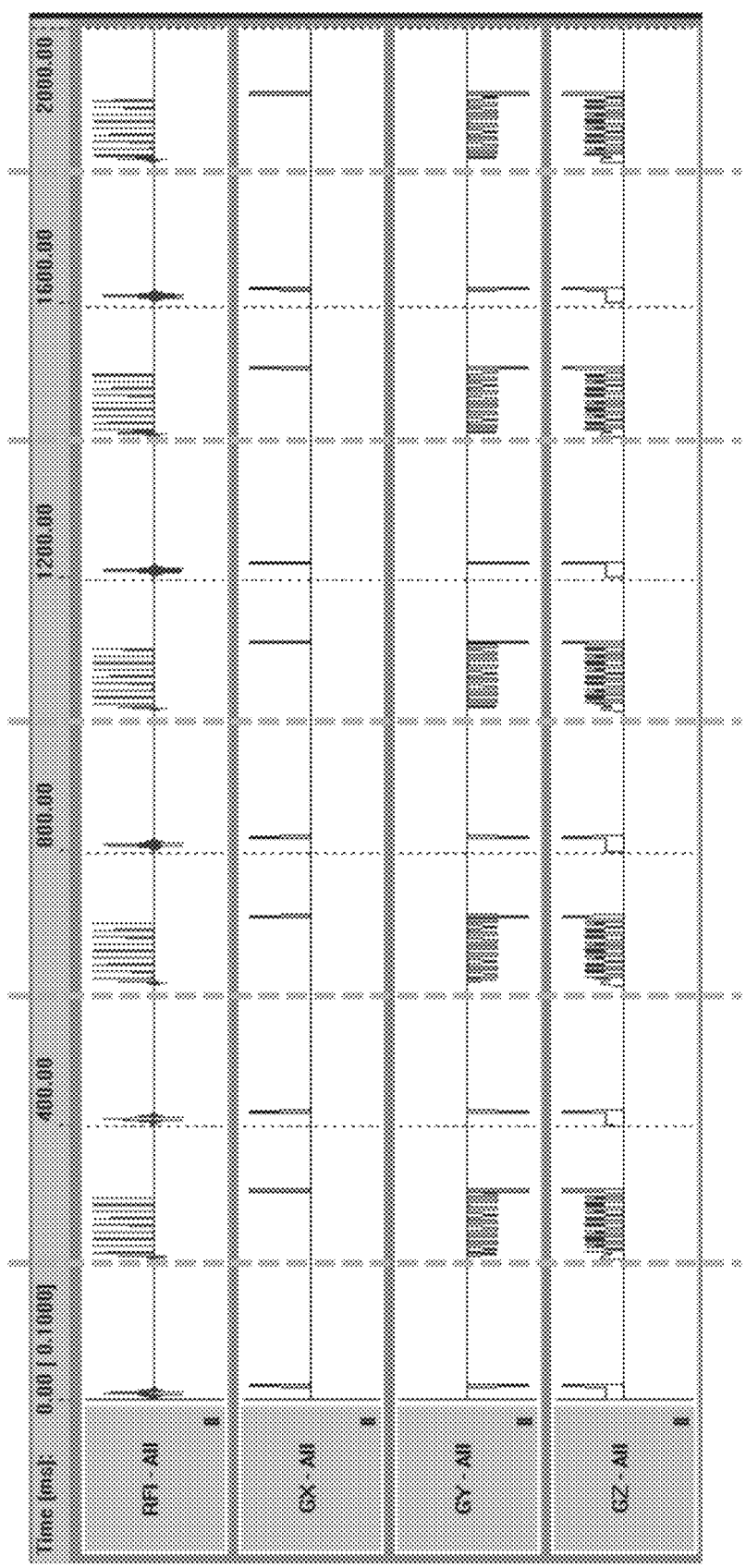
FIG. 5 illustrates an example of the insertion of kernel breakpoints based on the location of RF excite pulses according to one embodiment of the present disclosure.

In step 220, for each RF excite pulse identified in step 210, a kernel breakpoint is inserted, thus creating a set of high-level kernels, each of which could be further sub-partitioned into smaller kernels, as discussed below. For example, the five kernel breakpoints shown in FIG. 5 can be inserted to generate a set of initial kernels.

In step 230, within each kernel in the set of high-level kernels generated in step 220, locations of RF refocus pulses and readout events are identified.

In step 240, within each kernel in the set of high-level kernels generated in step 220, a kernel breakpoint is inserted following a last readout event after a last RF refocus pulse identified within that high-level kernel. Accordingly, the high-level kernel is further sub-divided. If no RF refocus pulses are identified within the high-level kernel, no kernel breakpoint is inserted in step 240.

Figure 6:
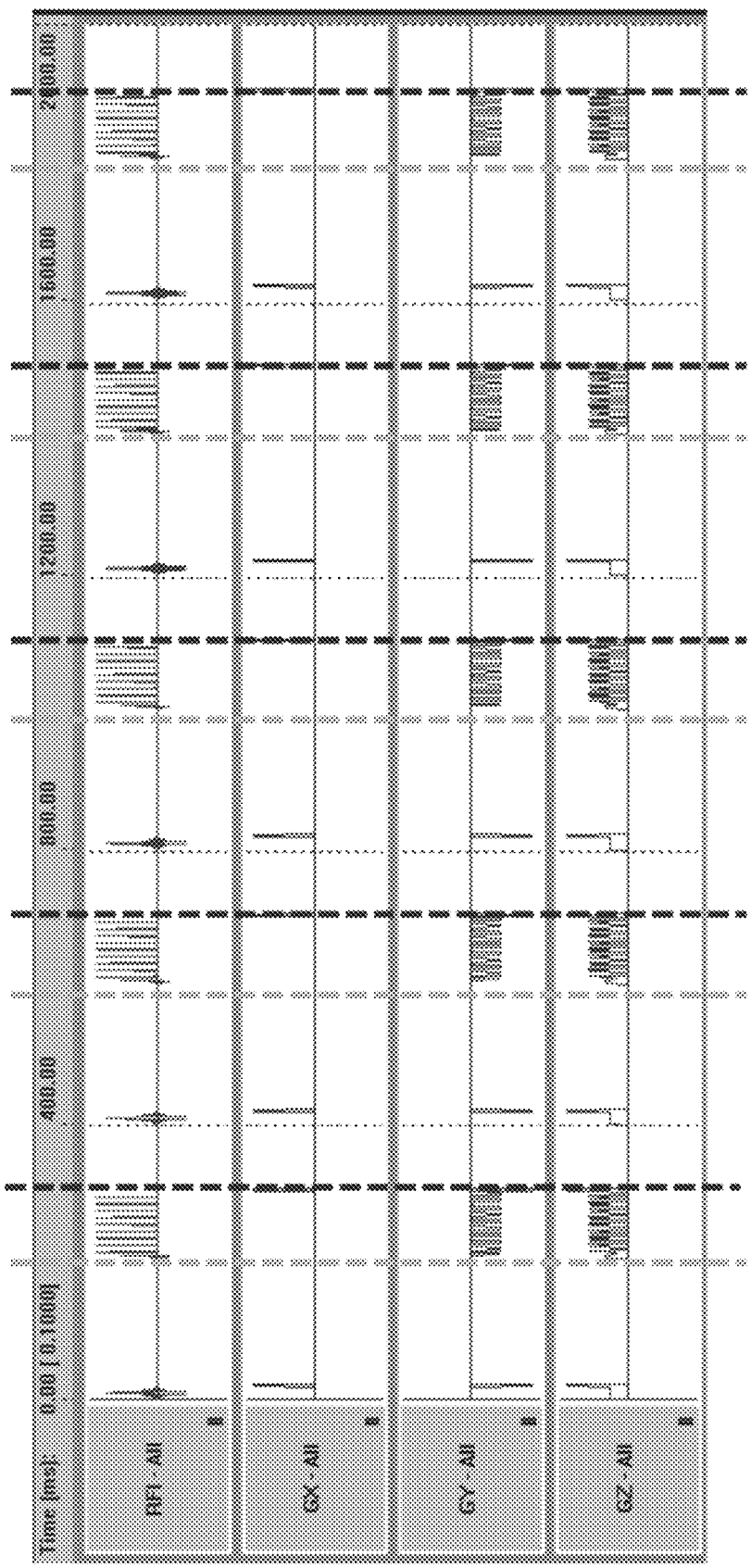
FIG. 6 illustrates an example of the insertion of kernel breakpoints based on the location of RF refocus pules and readout events according to one embodiment of the present disclosure.

In particular, as shown in the example of FIG. 6, five additional kernel breakpoints are inserted based on the locations of the last readout events in each initial kernel.

In step 250, locations of RF inversion pulses are identified within any of the existing kernels.

In step 260, for each RF inversion pulse identified in step 250, if there are no RF refocus pulses or readout events between the RF inversion pulse and a next RF excite pulse, a kernel breakpoint is inserted at the identified location of the RF inversion pulse.

Figure 7:
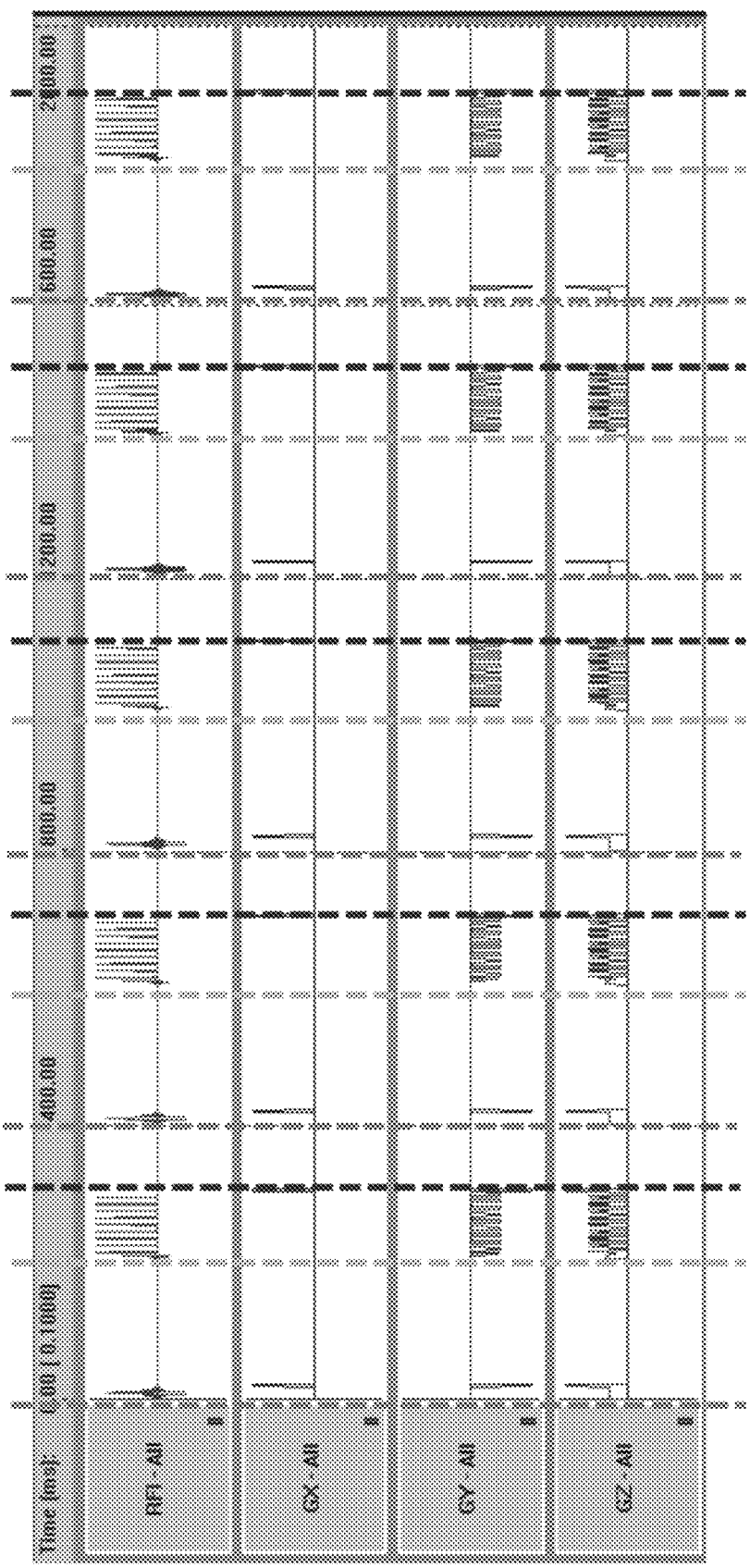
FIG. 7 illustrates an example of the insertion of kernel breakpoints based on the location of RF inversion pulses according to one embodiment of the present disclosure.

In particular, as shown in FIG. 7, five additional kernel breakpoints are inserted based on the locations of the RF inversion pulse. Thus, a total of fifteen physics-based kernels are generated by process 200, including five echo train kernels, five inversion kernels, and five dead-time kernels.

In other embodiments, steps 210-260 in method 200 can be performed in a different order, and need not be performed in the exact order shown in FIG. 2. For example, steps 230 and 240 could be performed before steps 210 and 220.

The present embodiments provide several advantages over a conventional MR spectrometer. For example, by removing the need for "on-the-fly" continuous stream processing, sequence modifications or corrections for the next kernel can be executed "just in time," which enables such modifications or corrections to be performed by a CPU, rather than an FPGA. Further, by using a CPU for the corrections, more sophisticated sequence/physics-adjustment models can be employed, e.g., handling unique inputs (thermal sensors), and using unique physics models for specific clinical applications. While some of these enhancements might be possible using FPGAs, they are easier to implement using a CPU-based approach with the kernel concept described above. In addition, upgrading to a more powerful CPU is less complicated than upgrading an FPGA.

Further, in the kernel-based approach of the present disclosure, each physics-based kernel will likely be longer than in a conventional, fixed-length approach, which provides more processing time to apply more sophisticated sequence adjustments and to use more sophisticated physics models. Moreover, the kernel-based approach of the present disclosure can lead to a reduction in processing power requirements.

In addition, the kernel-based approach of the present disclosure, in particular the use of a software-oriented solution, improves scalability of the MR spectrometer. For example, a high-level "research" scanner can use a more expensive, higher-performance processor and perform more complex physics corrections. Alternatively, a "value" scanner can use a less-expensive, lower-performance processor and perform simple physics corrections. In either case, it is simpler to scale the software complexity and/or CPU processor instead of using unique FPGA designs for each scanner.

Figure 8:
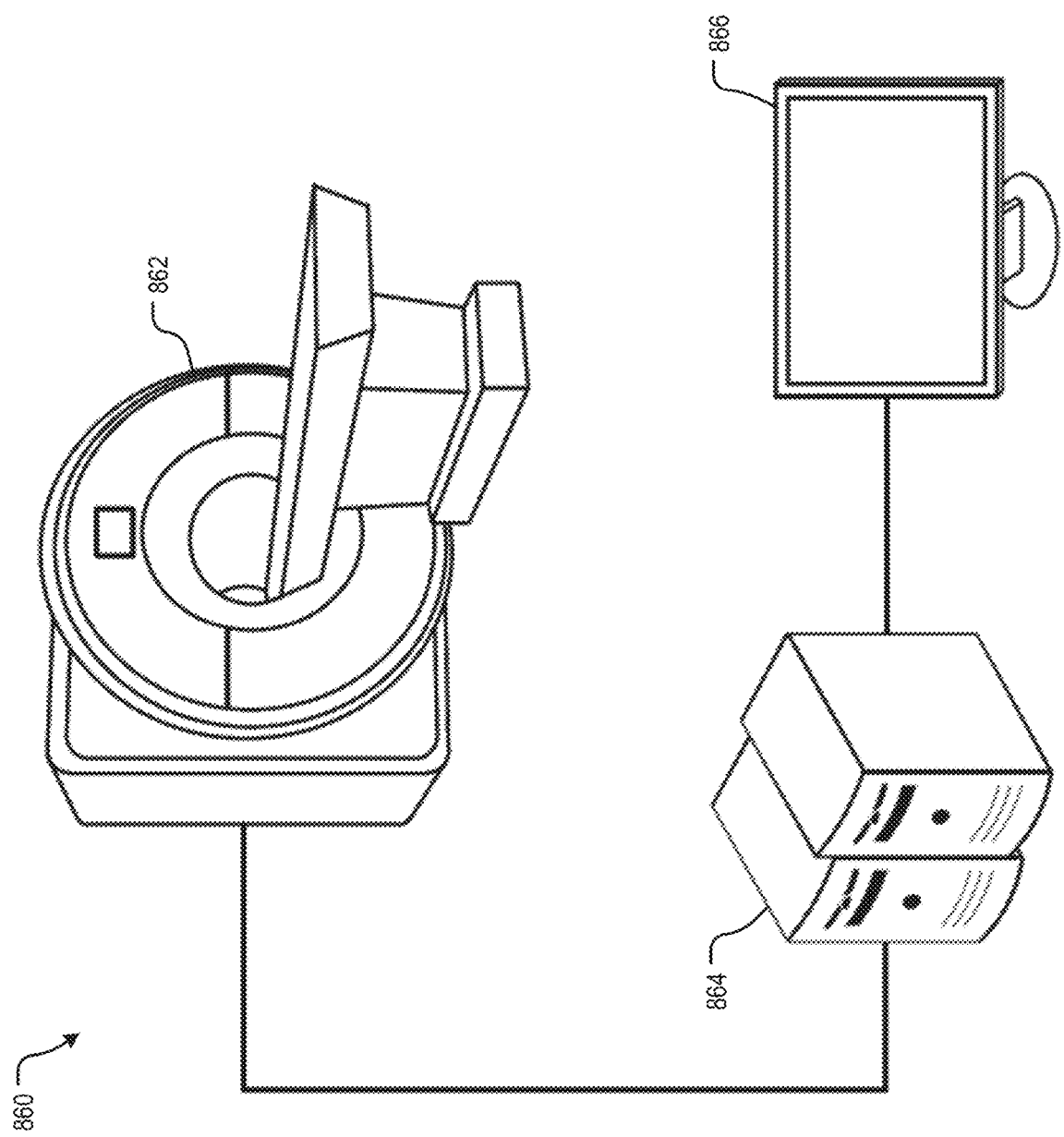
FIG. 8 is an illustration of a medical imaging system configured to implement a method of improved spectrometer processing, according to an exemplary embodiment of the present disclosure.

FIG. 8 illustrates an example embodiment of a medical-imaging system 860 within which method 100 of the present disclosure can be implemented. The medical-imaging system 860 includes at least one scanning device 862, one or more image-generation devices 864, each of which is a specially-configured computing device (e.g., a specially-configured desktop computer, a specially-configured laptop computer, a specially-configured server), and a display device 866.

The scanning device 862 is configured to acquire scan data by scanning a region (e.g., area, volume, slice) of an object (e.g., a patient). The scanning modality may be, for example, magnetic resonance imaging (MRI), computed tomography (CT), positron emission tomography (PET), X-ray radiography, and ultrasonography.

The one or more image-generation devices 864 obtain scan data from the scanning device 862 and generate an image of the region of the object based on the scan data. To generate the image, for example during intermediate image generation or during final image reconstruction, the one or more image-generation devices 864 may perform a reconstruction process on the scan data. Examples of reconstruction processes include GRAPPA, CG-SENSE, SENSE, ARC, SPIRIT, and LORAKS.

In an embodiment, after the one or more image-generation devices 864 generate the image, the one or more image-generation devices 864 send the image to the display device 864, which displays the image.

In another embodiment, and further to the above, the one or more image-generation devices 864 may generate two images from the same scan data. The one or more image-generation devices 864 may use different reconstruction processes to generate the two images from the same scan data, and one image may have a lower resolution than the other image. Additionally, the one or more image-generation devices 864 may generate an image.

Figure 9:
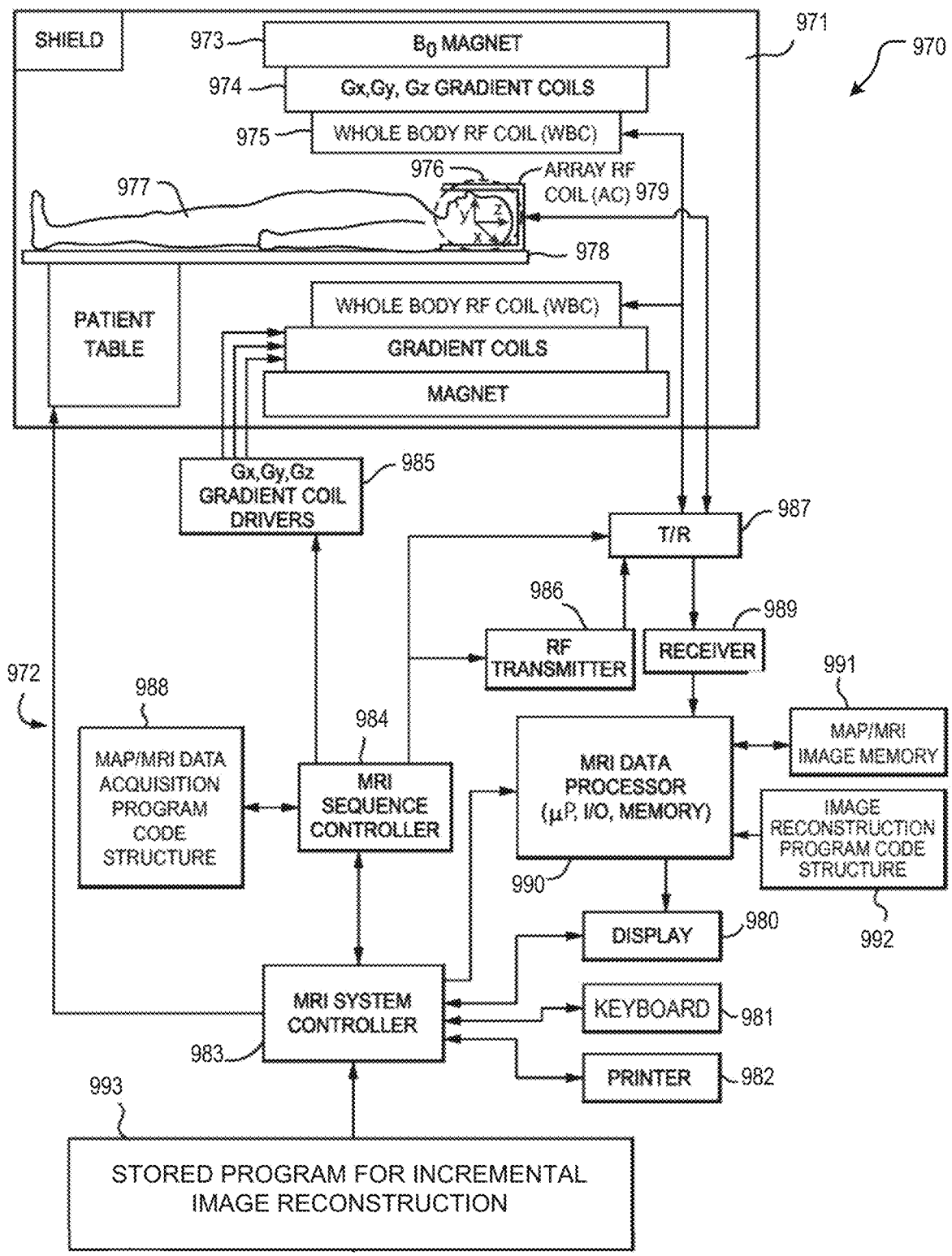
FIG. 9 is a schematic block diagram of a magnetic resonance imaging system, according to an exemplary implementation of the present disclosure.

Referring now to FIG. 9, a non-limiting example of a magnetic resonance imaging (MRI) system 970 is shown. The MRI system 970 depicted in FIG. 9 includes a gantry 971 (shown in a schematic cross-section) and various related system components 972 interfaced therewith. At least the gantry 971 is typically located in a shielded room. The MRI system geometry depicted in FIG. 9 includes a substantially coaxial cylindrical arrangement of the static field $B_0$ magnet 973, a Gx, Gy, and Gz gradient coil set 974, and a large whole-body RF coil (WBC) assembly 975. Along a horizontal axis of this cylindrical array of elements is an imaging volume 976 shown as substantially encompassing the head of a patient 977 supported by a patient table 978.

One or more smaller array RF coils 979 can be more closely coupled to the patient's head (referred to herein, for example, as "scanned object" or "object") in imaging volume 976. As those in the art will appreciate, compared to the WBC (whole-body coil), relatively small coils and/or arrays, such as surface coils or the like, are often customized for particular body parts (e.g., arms, shoulders, elbows, wrists, knees, legs, chest, spine, etc.). Such smaller RF coils are referred to herein as array coils (AC) or phased-array coils (PAC). These can include at least one coil configured to transmit RF signals into the imaging volume, and a plurality of receiver coils configured to receive RF signals from an object, such as the patient's head, in the imaging volume 976.

The MRI system 970 includes a MRI system controller 983 that has input/output ports connected to a display 980, a keyboard 981, and a printer 982. As will be appreciated, the display 980 can be of the touch-screen variety so that it provides control inputs as well. A mouse or other I/O device(s) can also be provided.

The MRI system controller 983 interfaces with a MRI sequence controller 984, which, in turn, controls the Gx, Gy, and Gz gradient coil drivers 985, as well as the RF transmitter 986, and the transmit/receive switch 987 (if the same RF coil is used for both transmission and reception). The MRI sequence controller 984 includes suitable program code structure 988 for implementing MRI imaging (also known as nuclear magnetic resonance, or NMR, imaging) techniques including parallel imaging. Moreover, the MRI sequence controller 984 includes processing circuitry to execute the scan control process illustrated in FIG. 1. The MRI sequence controller 984 can be configured for MR imaging with or without parallel imaging. Moreover, the MRI sequence controller 984 can facilitate one or more preparation scan (pre-scan) sequences, and a scan sequence to obtain a main scan magnetic resonance (MR) image (referred to as a diagnostic image). MR data from pre-scans can be used, for example, to determine sensitivity maps for RF coils 975 and/or 979 (sometimes referred to as coil sensitivity maps or spatial sensitivity maps), and to determine unfolding maps for parallel imaging.

The MRI system components 972 include an RF receiver 989 providing input to data processor 990 so as to create processed image data, which is sent to display 980. The MRI data processor 990 is also configured to access previously generated MR data, images, and/or maps, such as, for example, coil sensitivity maps, parallel image unfolding maps, distortion maps and/or system configuration parameters 991, and MRI image reconstruction program code structures 992 and 993.

In one embodiment, the MRI data processor 990 includes processing circuitry. The processing circuitry can include devices such as an application-specific integrated circuit (ASIC), configurable logic devices (e.g., simple programmable logic devices (SPLDs), complex programmable logic devices (CPLDs), and field programmable gate arrays (FPGAs), and other circuit components that are arranged to perform the functions recited in the present disclosure.

The processor 990 executes one or more sequences of one or more instructions, such as method 100 described herein, contained in the program code structures 992 and 993. Alternatively, the instructions can be read from another computer-readable medium, such as a hard disk or a removable media drive. One or more processors in a multi-processing arrangement can also be employed to execute the sequences of instructions contained in the program code structures 992 and 993. In alternative embodiments, hard-wired circuitry can be used in place of or in combination with software instructions. Thus, the disclosed embodiments are not limited to any specific combination of hardware circuitry and software.

Additionally, the term "computer-readable medium" as used herein refers to any non-transitory medium that participates in providing instructions to the processor 990 for execution. A computer readable medium can take many forms, including, but not limited to, non-volatile media or volatile media. Non-volatile media includes, for example, optical, magnetic disks, and magneto-optical disks, or a removable media drive. Volatile media includes dynamic memory.

Also illustrated in FIG. 9, and as referenced above, is a generalized depiction of an MRI system program storage (memory) 993, where stored program code structures are stored in non-transitory computer-readable storage media accessible to the various data processing components of the MRI system 970. As those in the art will appreciate, the program store 993 can be segmented and directly connected, at least in part, to different ones of the system 972 processing computers having most immediate need for such stored program code structures in their normal operation (i.e., rather than being commonly stored and connected directly to the MRI system controller 983).

Additionally, the MRI system 970 as depicted in FIG. 9 can be utilized to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Furthermore, not only does the physical state of the processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes an image reconstruction map (e.g., coil sensitivity map, unfolding map, ghosting map, a distortion map etc.) generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure, as does a particular structure of computer control program codes that, when sequentially loaded into instruction registers and executed by one or more CPUs of the MRI system 970, causes a particular sequence of operational states to occur and be transitioned through within the MRI system 970.

Numerous modifications and variations are possible in light of the above teachings. It is therefore to be understood that within the scope of the appended claims, the invention may be practiced otherwise than as specifically described herein.

Embodiments of the present disclosure may also be as set forth in the following parentheticals.

(1) An apparatus for magnetic resonance imaging, the apparatus comprising: processing circuitry configured to obtain a set of sequence instructions for performing a magnetic resonance scan; partition the obtained set of sequence instructions into a plurality of kernels by determining partition time points defining boundaries of the plurality of kernels, wherein the partition time points are not equally spaced in time; convert a first kernel of the plurality of kernels into a first hardware instruction set; transmit the first hardware instruction set to a hardware board controller for execution; and reconstruct a magnetic resonance image from received data, including data obtained by executing the first kernel.

(2) The apparatus of (1), wherein the processing circuitry is further configured to apply physics-based sequence corrections after converting the first kernel into the first hardware instruction set.

(3) The apparatus of (1), wherein the processing circuitry is further configured to apply physics-based sequence corrections before converting the first kernel into the first hardware instruction set.

(4) The apparatus of any of (1) to (3), wherein the processing circuitry is further configured to partition the obtained set of sequence instructions into the plurality of kernels using predetermined heuristics.

(5) The apparatus of any of (1) to (4), wherein the processing circuitry is further configured to partition the obtained set of sequence instructions into the plurality of kernels based on at least one location of an RF excitation pulse in the obtained set of sequence instructions.

(6) The apparatus of any of (1) to (5), wherein the processing circuitry is further configured to partition the obtained set of sequence instructions into the plurality of kernels based on at least one location of an RF inversion pulse in the obtained set of sequence instructions.

(7) The apparatus of (6), wherein the processing circuitry is further configured to partition the obtained set of sequence instructions into the plurality of kernels by inserting a kernel breakpoint at a location of an RF inversion event, when no RF refocus pulses or readout events are detected between the RF inversion event and a next RF excite pulse.

(8) The apparatus of any of (1) to (7), wherein the processing circuitry is further configured to partition the obtained set of sequence instructions into the plurality of kernels based on a location of an RF refocus pulse and a location of a readout event in the obtained set of sequence instructions.

(9) The apparatus of any of (1) to (8), wherein the processing circuitry is further configured to repeat the converting and transmitting steps for each kernel of the plurality of kernels following the first kernel.

(10) A method for performing magnetic resonance imaging, comprising: obtaining a set of sequence instructions for performing a magnetic resonance scan; partitioning the obtained set of sequence instructions into a plurality of kernels by determining partition time points defining boundaries of the plurality of kernels, wherein the partition time points are not equally spaced in time; converting a first kernel of the plurality of kernels into a first hardware instruction set; transmitting the first hardware instruction set to a hardware board controller for execution; and reconstructing a magnetic resonance image from received data, including data obtained by executing the first kernel.

(11) The method of (10), further comprising applying physics-based sequence corrections to the first kernel after the converting step.

(12) The method of (10), further comprising applying physics-based sequence corrections to the first kernel before the converting step.

(13) The method of any of (10) to (12), wherein the partitioning step further comprises partitioning the obtained set of sequence instructions into the plurality of kernels using predetermined heuristics.

(14) The method of any of (10) to (13), wherein the partitioning step further comprises partitioning the obtained set of sequence instructions into the plurality of kernels based on at least one location of an RF excitation pulse in the obtained set of sequence instructions.

(15) The method of any of (10) to (14), wherein the partitioning step further comprises partitioning the obtained set of sequence instructions into the plurality of kernels based on at least one location of an RF inversion pulse in the obtained set of sequence instructions.

(16) The method of (15), wherein the partitioning step further comprises partitioning the obtained set of sequence instructions into the plurality of kernels by inserting a kernel breakpoint at a location of an RF inversion event, when no RF refocus pulses or readout events are detected between the RF inversion event and a next RF excite pulse.

(17) The method of any of (10) to (16), wherein the partitioning step further comprises partitioning the obtained set of sequence instructions into the plurality of kernels based on a location of an RF refocus pulse and a location of a readout event in the obtained set of sequence instructions.

(18) The method of any of (10) to (17), further comprising repeating the converting and transmitting steps for each kernel of the plurality of kernels following the first kernel.

(19) A non-transitory computer-readable storage medium storing computer-readable instructions that, when executed by processing circuitry, cause the processing circuitry to perform a method, comprising: obtaining a set of sequence instructions for performing a magnetic resonance scan; partitioning the obtained set of sequence instructions into a plurality of kernels by determining partition time points defining boundaries of the plurality of kernels, wherein the partition time points are not equally spaced in time; converting a first kernel of the plurality of kernels into a first hardware instruction set; transmitting the first hardware instruction set to a hardware board controller for execution; and reconstructing a magnetic resonance image from received data, including data obtained by executing the first kernel.

Thus, the foregoing discussion discloses and describes merely exemplary embodiments of the present inventions. As will be understood by those skilled in the art, the present invention may be embodied in other specific forms without departing from the spirit or essential characteristics thereof. Accordingly, the disclosure of the present inventions is intended to be illustrative, but not limiting of the scope of the inventions, as well as other claims. The disclosure, including any readily discernible variants of the teachings herein, defines, in part, the scope of the foregoing claim terminology such that no inventive subject matter is dedicated to the public.

The invention claimed is:

1. An apparatus for magnetic resonance imaging, the apparatus comprising:
   processing circuitry configured to
      obtain a set of sequence instructions for performing a magnetic resonance scan;
      partition the obtained set of sequence instructions into a plurality of kernels by determining partition time points defining boundaries of the plurality of kernels, wherein the partition time points are not equally spaced in time;

convert a first kernel of the plurality of kernels into a first hardware instruction set;

transmit the first hardware instruction set to a hardware board controller for execution to obtain magnetic resonance scan data; and reconstruct a magnetic resonance image from the obtained magnetic resonance scan data by executing the first hardware instruction set.

2. The apparatus of claim 1, wherein the processing circuitry is further configured to apply physics-based sequence corrections after converting the first kernel into the first hardware instruction set.

3. The apparatus of claim 1, wherein the processing circuitry is further configured to apply physics-based sequence corrections before converting the first kernel into the first hardware instruction set.

4. The apparatus of claim 1, wherein the processing circuitry is further configured to partition the obtained set of sequence instructions into the plurality of kernels using predetermined heuristics.

5. The apparatus of claim 1, wherein the processing circuitry is further configured to partition the obtained set of sequence instructions into the plurality of kernels based on at least one location of an RF excitation pulse in the obtained set of sequence instructions.

6. The apparatus of claim 1, wherein the processing circuitry is further configured to partition the obtained set of sequence instructions into the plurality of kernels based on a location of an RF refocus pulse and a location of a readout event in the obtained set of sequence instructions.

7. The apparatus of claim 1, wherein the processing circuitry is further configured to repeat the converting and transmitting steps for each kernel of the plurality of kernels following the first kernel.

8. The apparatus of claim 1, wherein the processing circuitry is further configured to partition the obtained set of sequence instructions into the plurality of kernels based on at least one location of an RF inversion pulse in the obtained set of sequence instructions.

9. The apparatus of claim 8, wherein the processing circuitry is further configured to partition the obtained set of sequence instructions into the plurality of kernels by inserting a kernel breakpoint at a location of an RF inversion event, when no RF refocus pulses or readout events are detected between the RF inversion event and a next RF excite pulse.

10. A method for performing magnetic resonance imaging, comprising:

obtaining a set of sequence instructions for performing a magnetic resonance scan;

partitioning the obtained set of sequence instructions into a plurality of kernels by determining partition time points defining boundaries of the plurality of kernels, wherein the partition time points are not equally spaced in time;

converting a first kernel of the plurality of kernels into a first hardware instruction set;

transmitting the first hardware instruction set to a hardware board controller for execution to obtain magnetic resonance scan data; and reconstructing a magnetic resonance image from the obtained magnetic resonance scan data by executing the first hardware instruction set.

11. The method of claim 10, further comprising applying physics-based sequence corrections to the first kernel after the converting step.

12. The method of claim 10, further comprising applying physics-based sequence corrections to the first kernel before the converting step.

13. The method of claim 10, wherein the partitioning step further comprises partitioning the obtained set of sequence instructions into the plurality of kernels using predetermined heuristics.

14. The method of claim 10, wherein the partitioning step further comprises partitioning the obtained set of sequence instructions into the plurality of kernels based on at least one location of an RF excitation pulse in the obtained set of sequence instructions.

15. The method of claim 10, wherein the partitioning step further comprises partitioning the obtained set of sequence instructions into the plurality of kernels based on a location of an RF refocus pulse and a location of a readout event in the obtained set of sequence instructions.

16. The method of claim 10, further comprising repeating the converting and transmitting steps for each kernel of the plurality of kernels following the first kernel.

17. The method of claim 10, wherein the partitioning step further comprises partitioning the obtained set of sequence instructions into the plurality of kernels based on at least one location of an RF inversion pulse in the obtained set of sequence instructions.

18. The method of claim 17, wherein the partitioning step further comprises partitioning the obtained set of sequence instructions into the plurality of kernels by inserting a kernel breakpoint at a location of an RF inversion event, when no RF refocus pulses or readout events are detected between the RF inversion event and a next RF excite pulse.

19. A non-transitory computer-readable storage medium storing computer-readable instructions that, when executed by processing circuitry, cause the processing circuitry to perform a method, comprising:

obtaining a set of sequence instructions for performing a magnetic resonance scan;

partitioning the obtained set of sequence instructions into a plurality of kernels by determining partition time points defining boundaries of the plurality of kernels, wherein the partition time points are not equally spaced in time;

converting a first kernel of the plurality of kernels into a first hardware instruction set;

transmitting the first hardware instruction set to a hardware board controller for execution to obtain magnetic resonance scan data; and reconstructing a magnetic resonance image from the obtained magnetic resonance scan data by executing the first hardware instruction set.

* * * * *